US011088023B2

(12) United States Patent
Chen et al.

(10) Patent No.: US 11,088,023 B2
(45) Date of Patent: Aug. 10, 2021

(54) METHOD OF FORMING A SEMICONDUCTOR STRUCTURE

(71) Applicants: UNITED MICROELECTRONICS CORP., Hsin-Chu (TW); Fujian Jinhua Integrated Circuit Co., Ltd., Quanzhou (CN)

(72) Inventors: Pin-Hong Chen, Tainan (TW); Chih-Chieh Tsai, Kaohsiung (TW); Tzu-Chieh Chen, Pingtung County (TW); Kai-Jiun Chang, Taoyuan (TW); Chia-Chen Wu, Nantou County (TW); Yi-An Huang, New Taipei (TW); Tsun-Min Cheng, Changhua County (TW); Yi-Wei Chen, Taichung (TW); Wei-Hsin Liu, Changhua County (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 15/927,106

(22) Filed: Mar. 21, 2018

(65) Prior Publication Data
US 2018/0350673 A1   Dec. 6, 2018

(30) Foreign Application Priority Data
May 31, 2017   (CN) .......................... 201710413587.2

(51) Int. Cl.
*H01L 21/768* (2006.01)
*H01L 21/324* (2006.01)
*H01L 27/108* (2006.01)
*H01L 23/532* (2006.01)
*H01L 21/285* (2006.01)

(52) U.S. Cl.
CPC ...... *H01L 21/76883* (2013.01); *H01L 21/324* (2013.01); *H01L 21/76847* (2013.01);
(Continued)

(58) Field of Classification Search
CPC ......... H01L 21/76883; H01L 21/76847; H01L 21/76879; H01L 21/324;
(Continued)

(56) References Cited

U.S. PATENT DOCUMENTS 4,920,403 A * 4/1990 Chow ................. H01L 21/7684
216/21
4,933,743 A * 6/1990 Thomas .............. H01L 23/5221
257/742

(Continued)

FOREIGN PATENT DOCUMENTS

| CN | 1582345 A | 2/2005 |
| CN | 101866878 A | 10/2010 |
| CN | 102403353 A | 4/2012 |

*Primary Examiner* — Kyoung Lee
*Assistant Examiner* — Christina A Sylvia
(74) *Attorney, Agent, or Firm* — Winston Hsu

(57) ABSTRACT

A method of forming a semiconductor structure includes providing a material layer having a recess formed therein. A first tungsten metal layer is formed at a first temperature and fills the recess. An anneal process at a second temperature is then performed, wherein the second temperature is higher than the first temperature.

14 Claims, 5 Drawing Sheets

(52) U.S. Cl.
CPC .. *H01L 21/76877* (2013.01); *H01L 21/76879* (2013.01); *H01L 27/10855* (2013.01); *H01L 21/28556* (2013.01); *H01L 21/76876* (2013.01); *H01L 23/53266* (2013.01); *H01L 27/108* (2013.01)

(58) Field of Classification Search
CPC ....... H01L 21/76876–76883; H01L 21/28556; H01L 23/53266; H01L 27/10855; H01L 27/10847; H01L 27/108
See application file for complete search history.

(56) References Cited

U.S. PATENT DOCUMENTS

| | | | | |
|---|---|---|---|---|
| 5,407,698 A | * | 4/1995 | Emesh | C23C 16/02 257/E21.585 |
| 6,048,794 A | * | 4/2000 | Chen | H01L 21/28518 257/E21.165 |
| 6,221,762 B1 | * | 4/2001 | Byun | H01L 21/28518 257/E21.165 |
| 6,303,426 B1 | * | 10/2001 | Alers | H01L 28/60 257/E21.009 |
| 6,524,956 B1 | * | 2/2003 | Tian | H01L 21/28556 257/E21.17 |
| 6,638,861 B1 | | 10/2003 | Ngo | |
| 9,236,297 B2 | | 1/2016 | Chen | |
| 2003/0038369 A1 | * | 2/2003 | Layadi | H01L 23/53266 257/750 |
| 2004/0211665 A1 | * | 10/2004 | Yoon | H01L 21/2855 204/298.01 |
| 2005/0042829 A1 | * | 2/2005 | Kim | H01L 21/7685 438/268 |
| 2008/0254617 A1 | * | 10/2008 | Adetutu | H01L 21/76873 438/643 |
| 2009/0004848 A1 | * | 1/2009 | Kim | H01L 21/2855 438/644 |
| 2017/0084487 A1 | * | 3/2017 | Chebiam | H01L 21/76807 |

* cited by examiner

METHOD OF FORMING A SEMICONDUCTOR STRUCTURE

BACKGROUND OF THE INVENTION

1. Field of the Invention

The present invention relates to a method of forming a semiconductor device, and more particularly, a method of forming a semiconductor device by filling tungsten.

2. Description of the Prior Art

As electrical products become lighter, thinner, shorter and smaller, dynamic random access memories (DRAMs) are being scaled down to match these trends of high integration and high density. A DRAM comprising many memory cells is one of the most popular volatile memory devices utilized today. Each memory cell comprises a MOS transistor and at least a capacitor.

For reducing the cost and increasing the competitive power of DRAM devices, a three-dimensional DRAM structure has been developed. A crown-type capacitor is used in memory cells, wherein the crown-type capacitor is stacked on the transistor and couples to the transistor through a storage node contact (SNC). The quality of the SNC has a great influence on the yield and data storage speed of DRAMs.

As the dimensions of DRAMs are scaled down, the size of the SNC also becomes smaller, making the fabricating process of the SNC more difficult. As shown in FIG. 1, after the opening 102a of an SNC in a material layer 102 is defined, a metal material 104 fills in the opening 102a to form the SNC. During the formation of the metal material 104, however, the metal material 104 seals up the opening 102a before the opening 102a is filled. A seam or a void 106 will be formed within the metal material 104 filling in the opening 102a. The seam or the void 106 deteriorates the quality of the SNC and the yield of the DRAM.

SUMMARY OF THE INVENTION

It is therefore an objective of the present invention to provide a method of forming a semiconductor structure, and more particularly, a method of forming a semiconductor device by filling tungsten.

According to a preferred embodiment of the present invention, a method of forming a semiconductor structure includes providing a material layer. Later, a recess is formed in the material layer. Next, a first tungsten metal layer fills the recess at a first temperature. Finally, an anneal process is performed at a second temperature, wherein the second temperature is higher than the first temperature.

The method of the present invention provides a better filling performance of metal. It can be utilized when forming an SNC of a memory device, thereby avoiding seams or voids when filling with metal, and providing a lower resistance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 8 schematically depict a method of forming a semiconductor structure according to a preferred embodiment of the present invention, wherein:

FIG. 2 depicts a top view of a semiconductor device;
FIG. 3 depicts a sectional view taken along line A-A' in FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6; and
FIG. 8 is a fabricating stage following FIG. 7.
FIG. 9 and FIG. 10 depict a modification of a method of forming a DRAM according to an embodiment of the present invention, wherein:
FIG. 9 corresponds to the steps shown in FIG. 7; and
FIG. 10 is a fabricating stage following FIG. 9.

DETAILED DESCRIPTION

In the following description, numerous specific details are given to provide a thorough understanding of the invention. In order to focus on the specific inventive features of the present invention, some well-known system configurations and process steps are not disclosed in detail.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

The following description takes a dynamic random access memory (DRAM) as an example. The embodiment is for conveying the concepts to those skilled in the art; however, the method of the present invention is not limited to only form DRAMs. Other tungsten filled structures such as metal gates, source/drain plugs or metal redistribution layers can be formed by the present invention. The size and thickness disclosed in the following is only an example, and may be adjusted according to different requirements.

Figure 1:
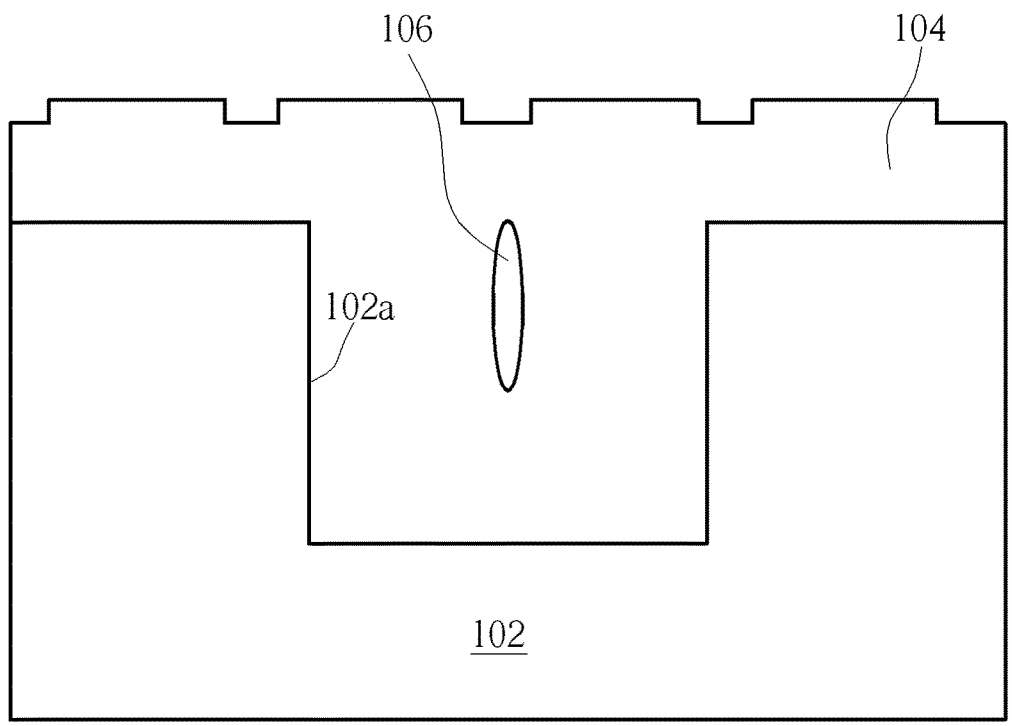
FIG. 1 depicts a seam or a void being formed when a recess is filled with metal by a conventional method.
Figure 2:
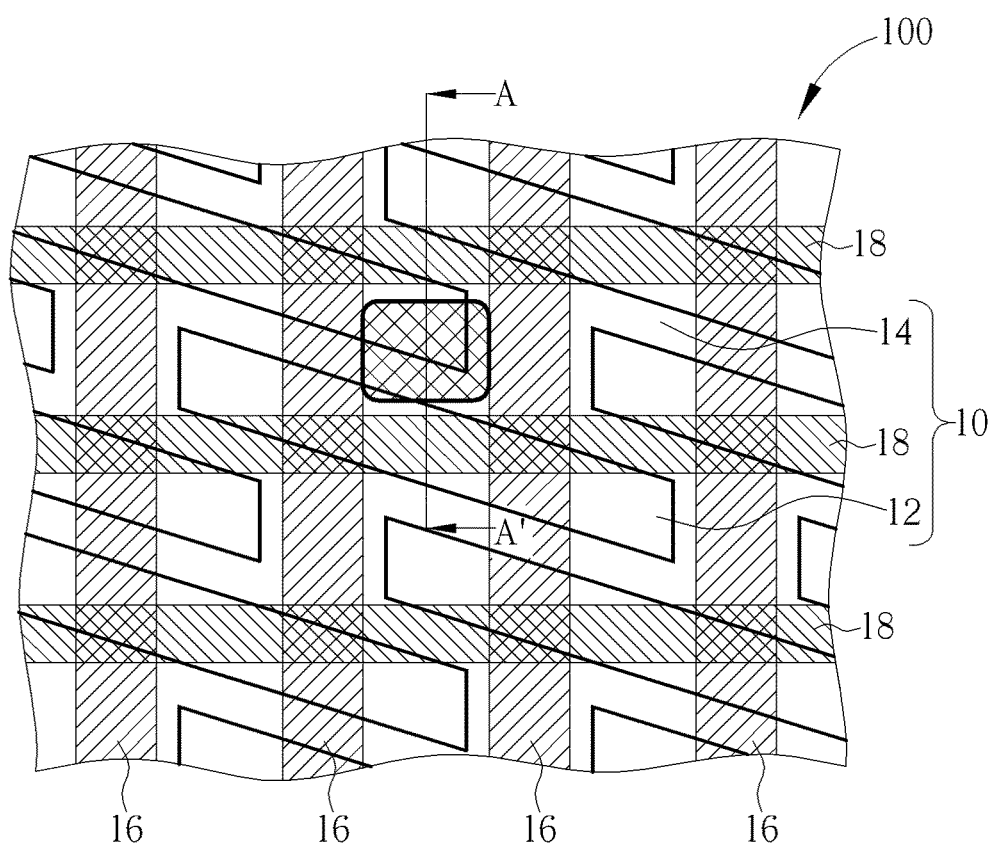

FIG. 2 to FIG. 8 schematically depict a method of forming a DRAM 100 according to a preferred embodiment of the present invention, wherein FIG. 2 depict a top view of a DRAM 100. FIG. 3 to FIG. 8 are sectional views taken along line A-A' in FIG. 2.

Figure 3:
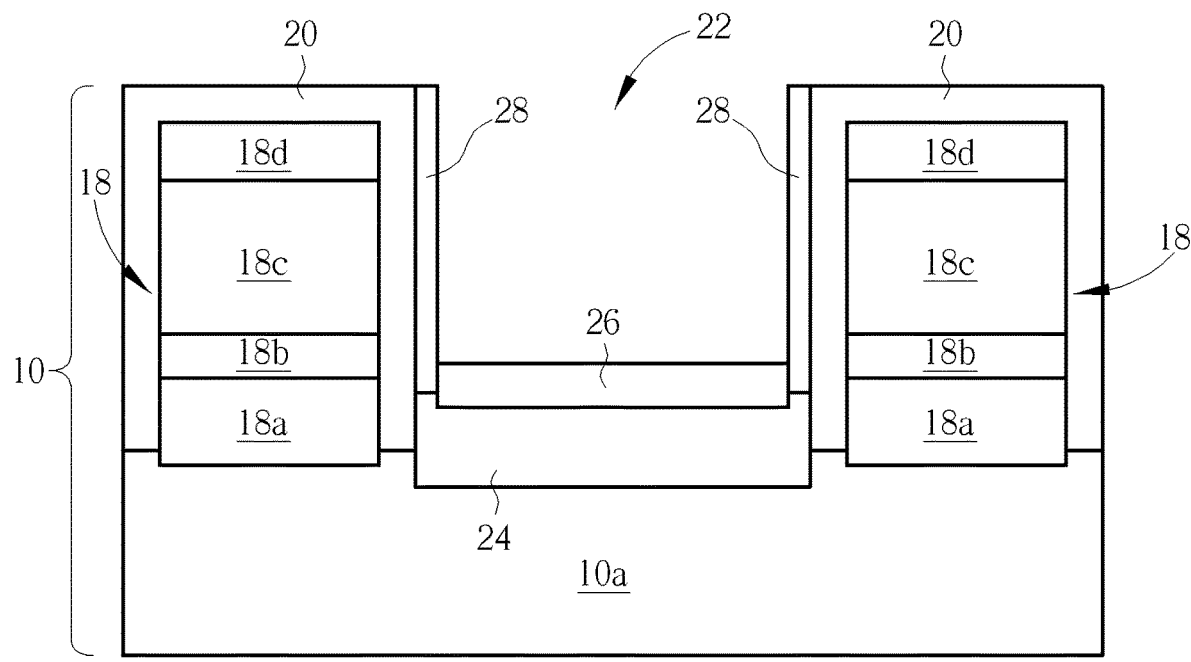

Please refer to FIG. 2 and FIG. 3. A material layer 10 such as a DRAM 100, which is partly completed, is provided. The material layer 10 includes a substrate 10a, numerous word lines 16 and numerous bit lines 18. A material of the substrate 10a may be a silicon substrate, an epitaxial silicon substrate, a silicon-germanium substrate, or a silicon-on-insulator (SOI) substrate, but is not limited to these materials. Numerous parallel active areas 12 are defined in the substrate 10a by shallow trench isolations (STIs) 14. The word lines 16 may be formed on the substrate 10a or within the substrate 10a. According to a preferred embodiment of the present invention, word lines 16 are buried word lines formed within the substrate 10a that cross the active areas 12 and STIs 14. Bit lines 18 are formed on the substrate 10a, and cross the active area 12, the STI 14 and the word lines 16. The bit lines 18 electrically connect to each of the active areas 12 through a bit line contact plug (not shown). The method of fabricating the word lines 16 may include forming a material layer on the substrate 10a followed by patterning the material layer. For example, after forming the word lines 16, a TiSi layer 18a, a WSi layer 18b, a tungsten metal layer 18c, and a cap layer 18d are formed in sequence on the substrate 10a, as shown in FIG. 3. In this embodiment, the tungsten metal layer 18c can be formed by a conventional chemical vapor deposition. The fabricating temperature of the tungsten metal layer 18c is about 400° C. An average grain size, i.e. average diameter of grains, of the tungsten metal layer 18c is between 70 nanometers and 100 nanometers, but is not limited to this size. Next, the TiSi layer 18a, the WSi layer 18b, the tungsten metal layer 18c, and the cap layer 18d are patterned to formed numerous bit lines 18. The patterning step may be performed by a lithographic process to remove part of the material layer. Preferably, the bit line contact plug (not shown) can be formed simultaneously and in one piece with the bit lines 18, but is not limited to this.

FIG. 3 depict a sectional view taken along line A-A' in FIG. 2. Line A-A' is substantially parallel to word lines 16, and intersects the substrate 10a between adjacent word lines 16 and adjacent bit lines 18. For the sake of clarity, the active areas 12 and the STIs 14 are not shown in FIG. 3. After forming the bit lines 18 as mentioned above, an insulating layer 20 can be formed on the substrate 10a to cover the substrate 10a and bit lines 18, and fill up the gap between bit lines 18. Later, a pattern process is performed to remove part of the insulating layer 20 between adjacent bit lines 18 to form a recess. 22. Part of the substrate 10a is exposed through the recess 22. The sidewall and top surface of the bit lines 18 are entirely covered by the insulating layer 20, and are not exposed. The recess 22 is a predetermined position of a storage node contact (SNC) of the DRAM 100. The depth and the width of the recess 22 are limited by the gap between bit lines 18 and the height of the bit lines 18. According to a preferred embodiment of the present invention, the depth of the recess 22 is about 250 nanometers, and the width of the recess 22 is about 50 nanometers. Therefore, the aspect ratio of the recess 22 is 5:1, but is not limited herein. The substrate 10a exposed through the recess 22 may form a source/drain region 24 and a silicide 26. The source/drain region 24 may be formed by epitaxial silicon doped with phosphorus. The silicide 26 may be CoSi. The silicide 26 can reduce the contact resistance between the SNC and the source/drain region 24. A spacer 28 such as a single-layered or multi-layered silicon nitride or silicon oxide can be formed optionally at the sidewall of the recess 22 to define a region for forming the silicide 26. The spacer 28 can make sure that the bit lines 18 and the SNC formed in the recess 22 are insulated from each other afterwards.

Figure 4:
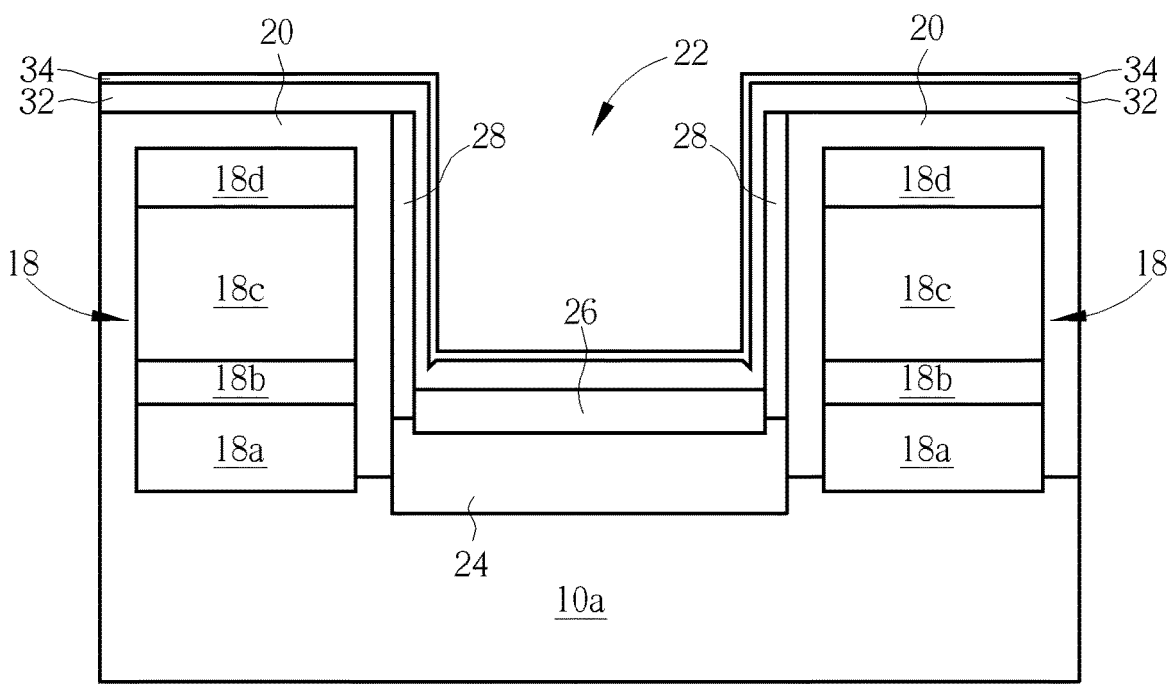

As shown in FIG. 4, a barrier 32 is formed to entirely cover the insulating layer 20, the sidewall of the recess 22 and the bottom of the recess 22. According to a preferred embodiment of the present invention, the barrier 32 can be single-layered or multi-layered. The steps of forming the barrier 32 may include forming a titanium layer by a chemical deposition process followed by forming a titanium nitride layer by an atomic layer deposition on the titanium layer. The thickness of the barrier 32 can be altered based on different requirements. For example, the barrier 32 may include a titanium layer having a thickness of 20 nanometers, and a titanium nitride having a thickness of 30 nanometers. In another embodiment of the present invention, the silicide 26 can be formed by reacting the titanium layer in the barrier 32 with the source/drain region 24 to form a TiSi silicide. In this way, the step of forming the silicide 26 before forming the barrier 32 can be omitted. After forming the barrier 32, a tungsten nucleation layer 34 is formed on the barrier 32. The tungsten nucleation layer 34 is formed by an atomic layer deposition at a temperature between 250° C. and 350° C. to gain better surface coverage and controllable thickness. The thickness of the tungsten nucleation layer 34 is preferably 40 nanometers. The average grain size, i.e. average diameter of grains, of the tungsten nucleation layer 34 is not greater than 30 nanometers. The tungsten nucleation layer 34 can provide a deposition surface with high reactivity to help forming of the tungsten metal layer 36.

Figure 5:
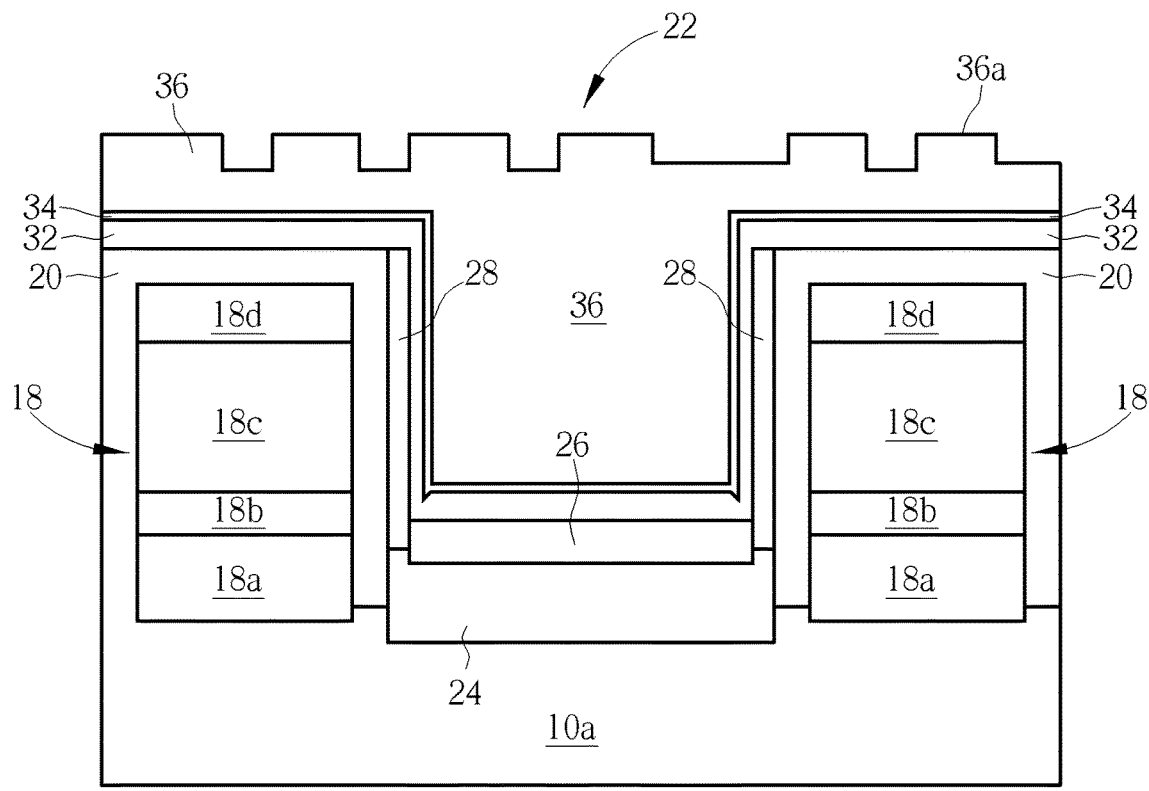

As shown in FIG. 5, a tungsten metal layer 36 is formed on the tungsten nucleation layer 34, entirely covering the bit lines 18 and filling up the recess 22 between the bit lines 18. It is noteworthy that the tungsten metal layer 36 is formed by a chemical vapor deposition at a temperature between 250° C. and 350° C. Compared to the conventional chemical vapor deposition for forming a tungsten layer at a temperature of 400° C., such as the method for forming the tungsten metal layer 18c of the bit line 18, the method provided by the present invention forms the tungsten metal layer 36 at a lower temperature which can reduce the deposition speed and average grain size of the tungsten metal layer 36. That is, the tungsten metal layer 36 may have a surface topography variation smaller than that of the tungsten layer formed by the conventional chemical vapor deposition. Accordingly, the thickness of the tungsten metal layer 36 can be increased evenly until completely filling up the recess 22 during the chemical vapor deposition at a lower temperature. In this way, a seam or a void enclosed in the recess 22 caused by early sealed-up of the recess 22 may be prevented, and the yield of the SNC is thereby improved. According to the preferred embodiment of the present invention, the average grain size of the tungsten metal layer 36 filling in the recess 22 is smaller than the average grain size of the tungsten metal layer 18c in the bit lines 18. For example, if the average grain size of the tungsten metal layer 18c is between 70 nanometers and 100 nanometers, the average grain size of the tungsten metal layer 36 is smaller than 70 nanometers, i.e. between 60 nanometers and 70 nanometers. As shown in FIG. 5, the tungsten metal layer 36 has a rough surface 36a because of the grain structure.

Figure 6:
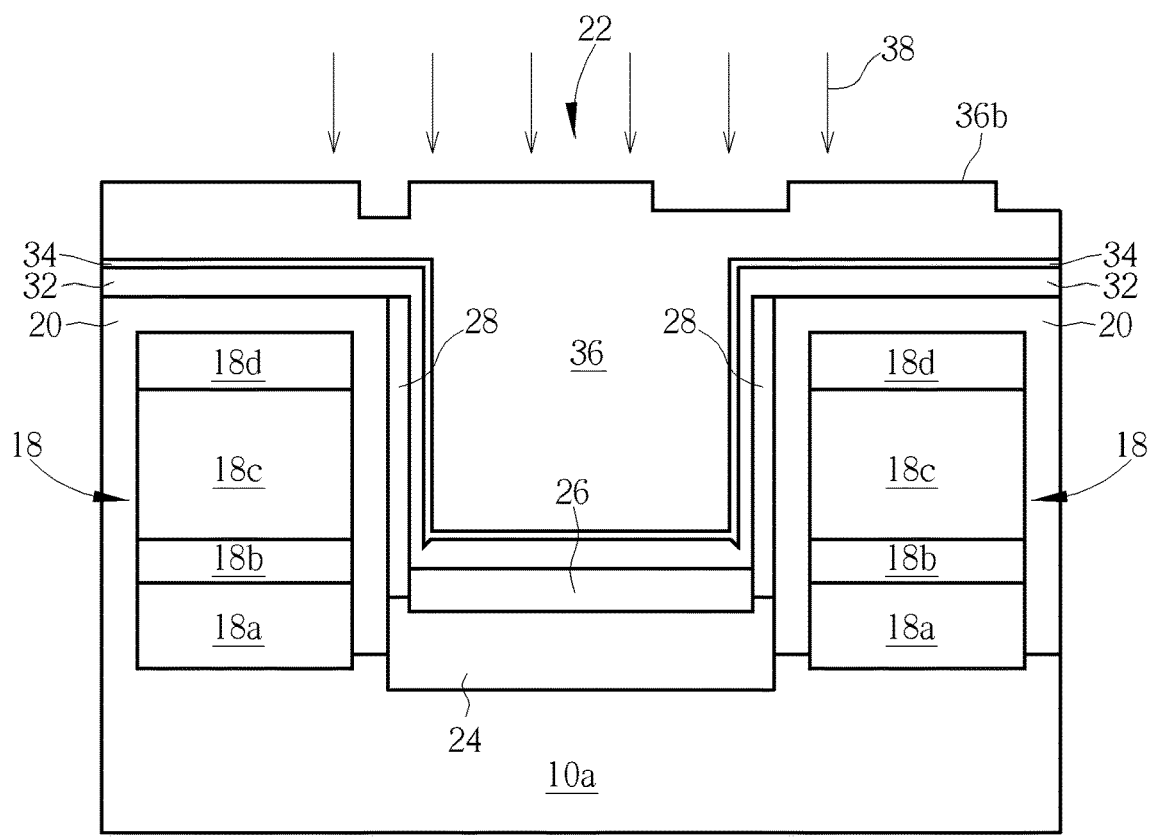

Please refer to FIG. 6. An anneal process 38 is performed in an inert ambient, such as by introducing nitrogen gas. According to a preferred embodiment of the present invention, the anneal process 38 may be a rapid thermal anneal (RTA) performed at a temperature greater than the temperature of forming the tungsten metal layer 36. For example, the anneal process 38 is performed at a temperature greater than 350° C., preferably between 400° C. and 500° C. The operating time of the anneal process 38 is not greater than 1 minute. The anneal process 38 can improve the grain growth of the tungsten grain, and has an obvious effect on the tungsten metal layer 36 formed at a lower temperature. In this embodiment, the anneal process 38 can increase the average grain size of the tungsten metal layer 36 by 10% to 50%, preferably 40% to 50%. For example, if the average grain size of the tungsten metal layer 36 is between 60 nanometers to 70 nanometers before the anneal process 38, the average grain size of the tungsten metal layer 36 is increased to become between 70 nanometers and 100 nanometers after the anneal process 38. The change of the average grain size of the tungsten metal layer 36 influences the surface topography of the tungsten metal layer 36. The rough surface 36b of the tungsten metal layer 36 after the anneal process 38 has fewer grain boundaries than the rough surface 36a of the tungsten metal layer 36 before the anneal process 38. Preferably, after the anneal process 38, the tungsten metal layer 36 and the tungsten metal layer 18c have substantially the same average grain size and similar resistance.

Figure 7:
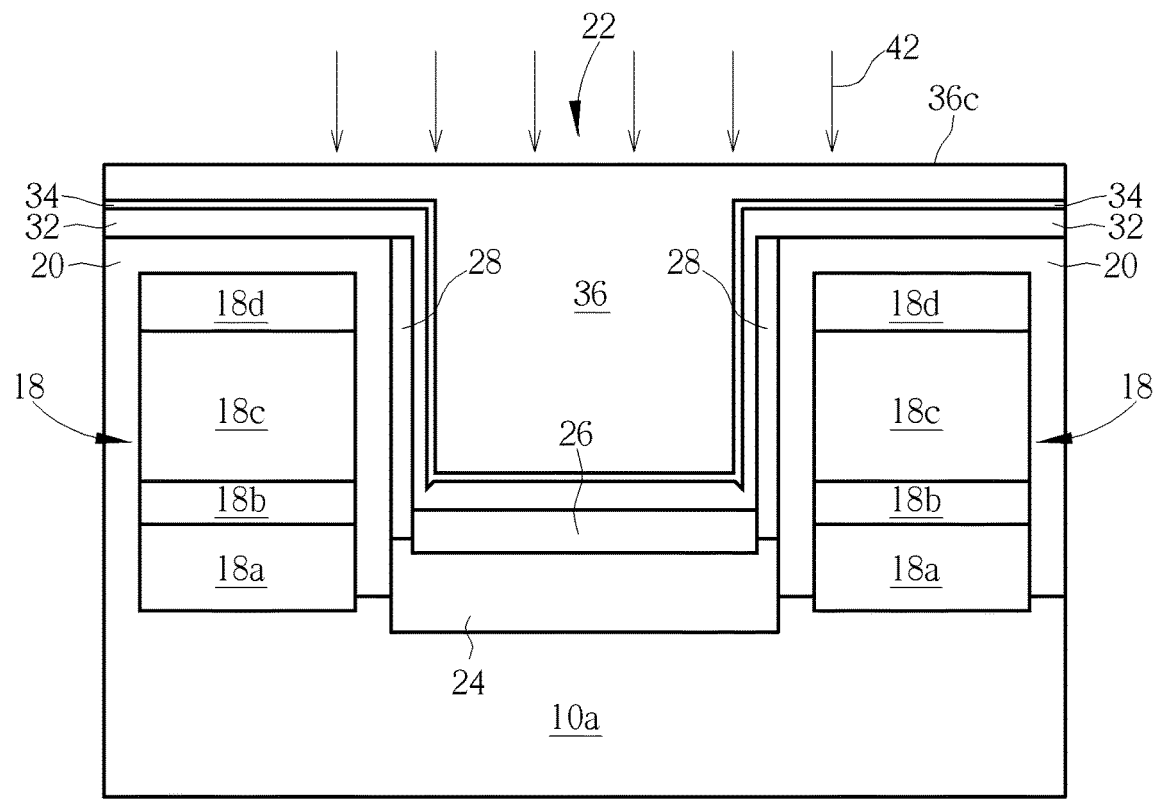

Please refer to FIG. 7. A planarization process 42 such as a chemical mechanical planarization or an etching-back is performed to planarize the tungsten metal layer 36 to obtain a planar surface 36c by removing the rough surface 36b. After the planarization process 42, the tungsten nucleation layer 34 or the barrier 32 is not exposed.

Figure 8:
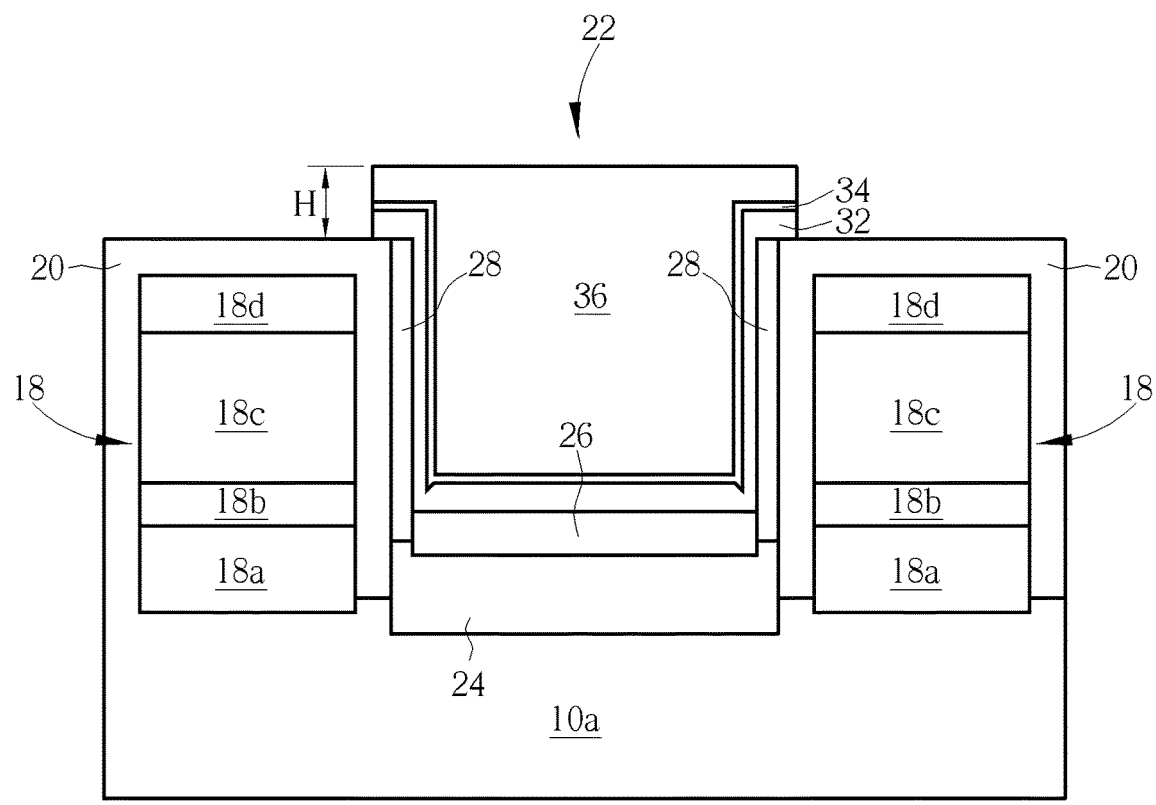

Please refer to FIG. 8. Another patterning process is performed to define each SNC 44. For example, part of the tungsten metal layer 36, part of the tungsten nucleation layer 34, and part of the barrier 32 are removed by performing a photolithography and etching process to expose the insulating layer 20, and the remaining tungsten metal layer 36, the tungsten nucleation layer 34, and the barrier 32 only fill in the recess 22, and protrude from the opening of the recess 22 by a height H. The protruding portion of the tungsten metal layer 36 will serve as an SNC pad to connect to a capacitor formed in a later process. As shown in FIG. 8, the tungsten metal layer 36, the tungsten nucleation layer 34, and the barrier 32 protrude from the opening of the recess 22 and extend laterally to cover the insulating layer 20 around the recess 22. Therefore, the cross section of the tungsten metal layer 36 of the SNC 44 is T-shaped, and the cross section of the tungsten nucleation layer 34 and the cross section of the barrier 32 are both in the shape of an upside-down Ω.

Figure 9:
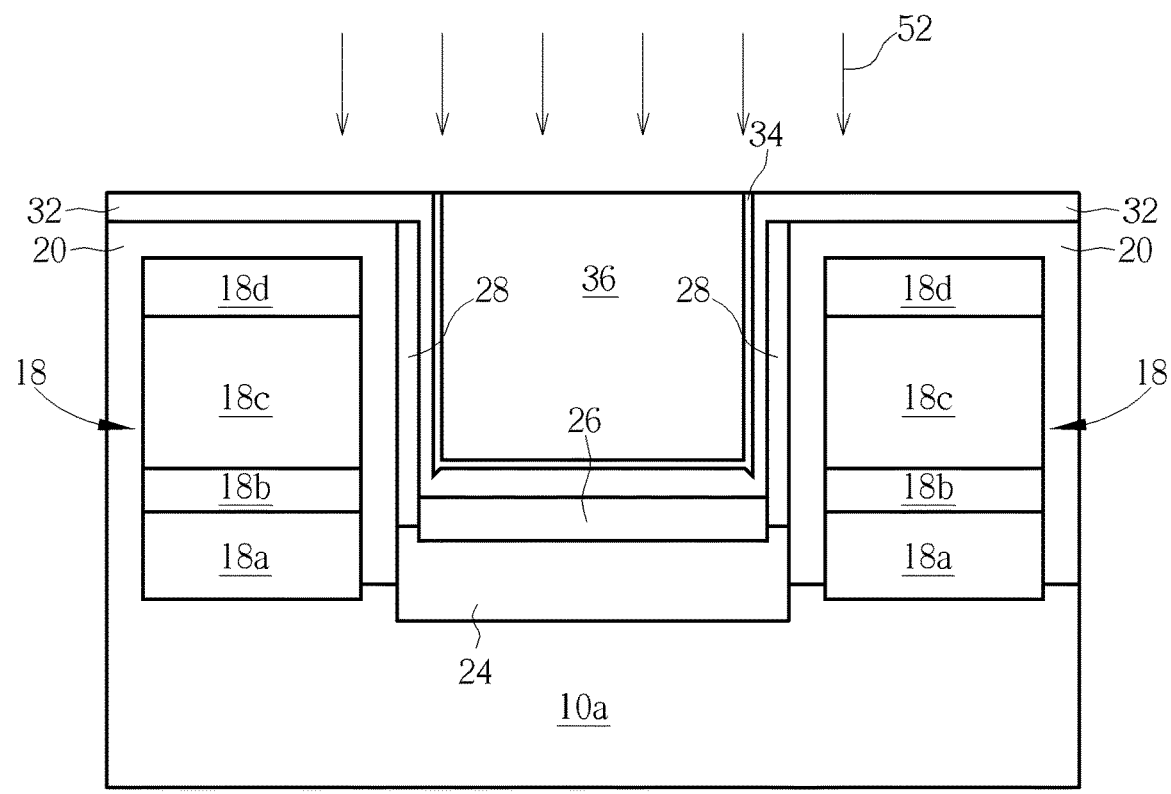
Figure 10:
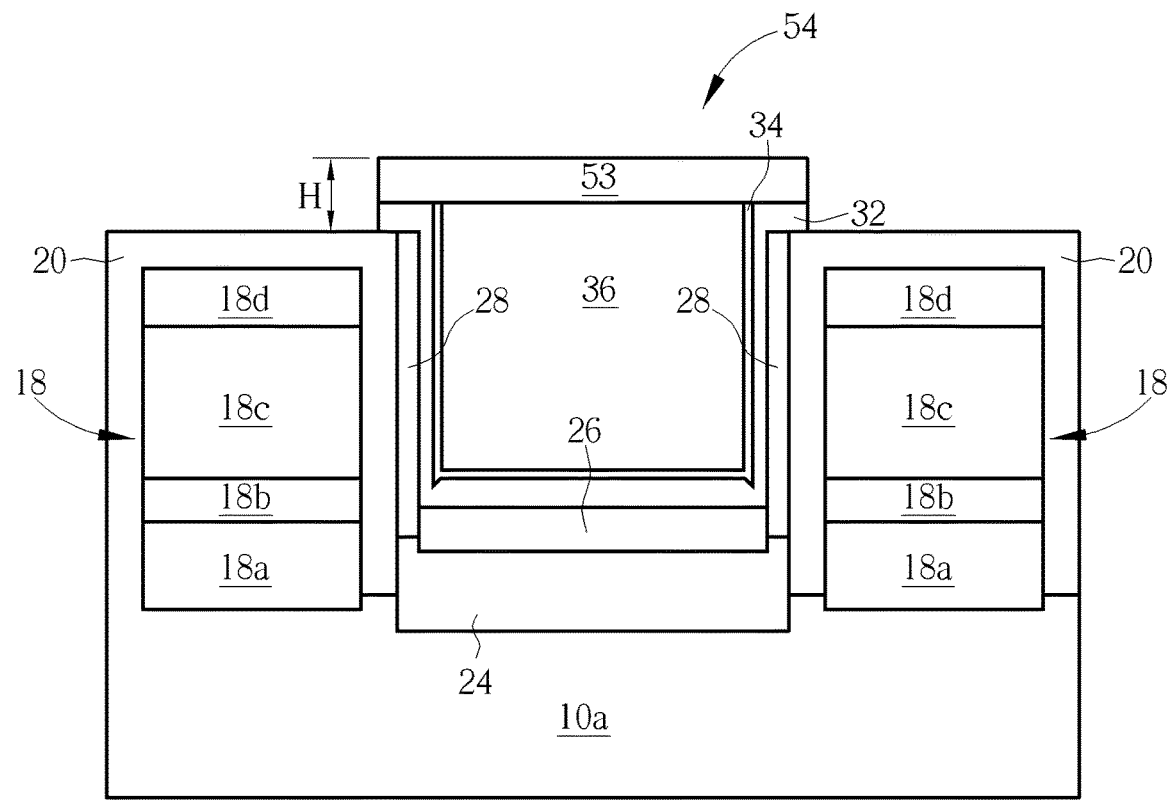

FIG. 9 and FIG. 10 depict a modification of a method of forming a DRAM of the present invention, wherein FIG. 9 corresponds to steps shown in FIG. 7. Please refer to FIG. 9. A planarization process 52 can remove part of the tungsten metal layer 36 and the tungsten nucleation layer 34 to expose the barrier 32 on the bit lines 18. The remaining tungsten metal layer 36 and the tungsten nucleation layer 34 only fill in the recess 22, and the top surface of the remaining tungsten metal layer 36 and the top surface of the remaining tungsten nucleation layer 34 are aligned with the top surface of the barrier 32. As shown in FIG. 10, a metal cap layer 53 such as another tungsten metal layer or other conductive metal layer is deposited. Then, the metal cap layer 53 and the barrier 32 are patterned to remove part of the metal cap layer 53 and the barrier 32 to define each SNC 54, and to expose the insulating layer 20 on the bit lines 18. As shown in FIG. 10, the SNC 54 can protrude from the opening of the recess 22 at a height H. The barrier 32 covers the sidewall and the bottom of the recess 22 and extends to the insulating layer 20 around the recess 22. The cross section of the barrier 32 is in the shape of an upside-down Ω. The tungsten metal layer 36 fills in the recess 22 and the top surface of the tungsten metal layer 36 is aligned with the top surface of the barrier 32. The tungsten nucleation layer 34 is between the barrier 32 and the tungsten metal layer 36. The cross section of the tungsten nucleation layer 34 is U-shaped. The metal cap layer 53 is disposed directly on the tungsten metal layer 36. The sidewall of the metal cap layer 53 is aligned with the sidewall of the barrier 32. The metal cap layer 53 can serve as an SNC pad of the SNC 54.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:
   providing a material layer;
   forming a recess in the material layer, wherein the material layer comprises a plurality of electrical connecting structures, each of the plurality of electrical connecting structures is formed by a second tungsten metal layer, and the recess is between two of the plurality of electrical connecting structures;
   forming a first tungsten metal layer filling the recess at a first temperature; and
   performing an anneal process in an inert ambient at a second temperature, wherein the second temperature is higher than the first temperature, the first temperature is between 250° C. and 350° C., and the second temperature is between 400° C. and 500° C.

2. The method of forming a semiconductor structure of claim 1, wherein the anneal process comprises a rapid thermal anneal process.

3. The method of forming a semiconductor structure of claim 1, wherein an operating time of the anneal process is not greater than one minute.

4. The method of forming a semiconductor structure of claim 3, wherein the anneal process comprises introducing nitrogen gas.

5. The method of forming a semiconductor structure of claim 1, wherein an average grain size of the first tungsten metal layer before performing the anneal process is smaller than 70 nanometers, and the average grain size of the first tungsten metal layer after performing the anneal process is between 70 nanometers and 100 nanometers.

6. The method of forming a semiconductor structure of claim 1, wherein an average grain size of the first tungsten metal layer after the anneal process increases by 40% to 50% with respect to the average grain size of the first tungsten metal layer before the anneal process.

7. The method of forming a semiconductor structure of claim 1, further comprising:
   before forming the first tungsten metal layer, forming a tungsten nucleation layer at the first temperature to cover a sidewall of the recess and a bottom of the recess.

8. The method of forming a semiconductor structure of claim 7, wherein before the anneal process, an average grain size of the tungsten nucleation layer is not greater than 30 nanometers.

9. The method of forming a semiconductor structure of claim 7, further comprising forming a barrier between the tungsten nucleation layer and the material layer.

10. The method of forming a semiconductor structure of claim 1, wherein the second tungsten metal layer is formed at a third temperature.

11. The method of forming a semiconductor structure of claim 10, wherein the third temperature is between the first temperature and the second temperature.

12. The method of forming a semiconductor structure of claim 1, wherein before the anneal process, an average grain size of the second tungsten metal layer is greater than an average grain size of the first tungsten metal layer.

13. The method of forming a semiconductor structure of claim 12, wherein after the anneal process, the average grain size of the second tungsten metal layer is substantially equal to the average grain size of the first tungsten metal layer.

14. The method of forming a semiconductor structure of claim 1, wherein before the anneal process, an average grain size of the second tungsten metal layer is between 70 nanometers and 100 nanometers.

* * * * *